US012749549B2

(12) United States Patent
Inoue

(10) Patent No.: US 12,749,549 B2
(45) Date of Patent: Sep. 29, 2026

(54) SEMICONDUCTOR SYSTEM AND WIRING DEFECT DETECTING METHOD

(71) Applicant: KIOXIA CORPORATION, Tokyo (JP)

(72) Inventor: Kouichirou Inoue, Yokosuka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 725 days.

(21) Appl. No.: 17/679,857

(22) Filed: Feb. 24, 2022

(65) Prior Publication Data

US 2023/0073181 A1 Mar. 9, 2023

(30) Foreign Application Priority Data

Sep. 6, 2021 (JP) ................................ 2021-144898

(51) Int. Cl.
*G11C 29/02* (2006.01)
*G11C 16/04* (2006.01)
(Continued)

(52) U.S. Cl.
CPC ............ *G11C 29/025* (2013.01); *G11C 16/08* (2013.01); *H10W 90/00* (2026.01);
(Continued)

(58) Field of Classification Search
CPC ....... H01L 2224/48; H01L 2224/48137; H01L 2224/48145; H01L 2224/859; H01L 24/48;
(Continued)

(56) References Cited

U.S. PATENT DOCUMENTS 7,859,284 B2 12/2010 Ikeda
2003/0197515 A1 10/2003 Ishigaki
(Continued)

FOREIGN PATENT DOCUMENTS

CN 102338848 A 2/2012
JP 2009-002837 A 1/2009
JP 2017-026463 A 2/2017

OTHER PUBLICATIONS

Chinese Office Action dated Nov. 7, 2025 in corresponding Chinese Patent Application 202210790798.9 with English Translation, 12 pages.
Chinese Office Action mailed May 29, 2026 in corresponding Chinese Patent Application 202210790798.9 with English Translation, 14 pages.

*Primary Examiner* — Judy Nguyen
*Assistant Examiner* — Adam S Clarke
(74) *Attorney, Agent, or Firm* — Kim & Stewart LLP

(57) ABSTRACT

A semiconductor system includes a first semiconductor chip, a second semiconductor chip stacked above the first semiconductor chip, a controller configured to control the first and second semiconductor chips, a first wiring connected between the controller and each of the first and second semiconductor chips and by which a first signal is to be transmitted from the controller to each of the first and second semiconductor chips, a second wiring connected between the controller and the first semiconductor chip and by which a current of the first signal flowing through the first wiring to the first semiconductor chip is to be returned to the controller, and a third wiring connected between the controller and the second semiconductor chip and by which a current of the first signal flowing through the first wiring to the second semiconductor chip is to be returned to the controller.

20 Claims, 4 Drawing Sheets

(51) Int. Cl.
*G11C 16/08* (2006.01)
*H10W 90/00* (2026.01)

(52) U.S. Cl.
CPC ....... *G11C 16/0483* (2013.01); *H10W 90/752* (2026.01); *H10W 90/753* (2026.01)

(58) Field of Classification Search
CPC ..... H01L 24/85; H01L 25/0652; H01L 25/18; H10W 72/07531; H10W 72/07551; H10W 72/50; H10W 90/00; H10W 90/752; H10W 90/753; G11C 16/0483; G11C 16/08; G11C 29/023; G11C 29/025; G11C 29/1201; G11C 5/06
See application file for complete search history.

(56) References Cited

U.S. PATENT DOCUMENTS

| | | | | |
|---|---|---|---|---|
| 2012/0013359 | A1 | 1/2012 | Shao | |
| 2013/0033948 | A1* | 2/2013 | Braceras | G11C 29/025 365/201 |
| 2018/0060265 | A1* | 3/2018 | Ito | G06F 13/4068 |
| 2018/0096979 | A1* | 4/2018 | Pappu | G11C 5/025 |
| 2019/0043537 | A1* | 2/2019 | Yamada | G11C 29/781 |
| 2019/0180818 | A1 | 6/2019 | Miyamura | |
| 2021/0249076 | A1 | 8/2021 | Jung | |
| 2023/0067813 | A1* | 3/2023 | Kim | G11C 16/24 |

* cited by examiner

SEMICONDUCTOR SYSTEM AND WIRING DEFECT DETECTING METHOD

CROSS-REFERENCE TO RELATED APPLICATION(S)

This application is based upon and claims the benefit of priority from Japanese Patent Application No. 2021-144898, filed Sep. 6, 2021, the entire contents of which are incorporated herein by reference.

FIELD

Embodiments described herein relate generally to a semiconductor system and a wiring defect detecting method.

BACKGROUND

A stacking technique by which semiconductor chips are stacked, connected to each other using bonding wires and packaged, has become widely used. In a case where a defect is detected in a signal transferred from a controller through a bonding wire, there is a need to easily and accurately detect the cause of the defect in the signal without separating the package.

DETAILED DESCRIPTION

Embodiments provide a semiconductor system and a wiring defect detecting method by which a cause of a defect in a signal can be easily and accurately detected without separating a package of the semiconductor system.

In general, according to one embodiment, a semiconductor system includes a first semiconductor chip, a second semiconductor chip stacked above the first semiconductor chip, a controller configured to control the first and second semiconductor chips, a first wiring connected between the controller and each of the first and second semiconductor chips and by which a first signal is to be transmitted from the controller to each of the first and second semiconductor chips, a second wiring connected between the controller and the first semiconductor chip and by which a current of the first signal flowing through the first wiring to the first semiconductor chip is to be returned to the controller, and a third wiring connected between the controller and the second semiconductor chip and by which a current of the first signal flowing through the first wiring to the second semiconductor chip is to be returned to the controller.

Hereinafter, embodiments of the semiconductor system and the wiring defect detecting method will be described with reference to the accompanying drawings. While descriptions will be made focusing on main components of the semiconductor system, the semiconductor system may have components or functions that are not illustrated or described herein. The descriptions herein below are not intended to exclude the components or functions that are not illustrated or described herein.

First Embodiment

Figure 1:
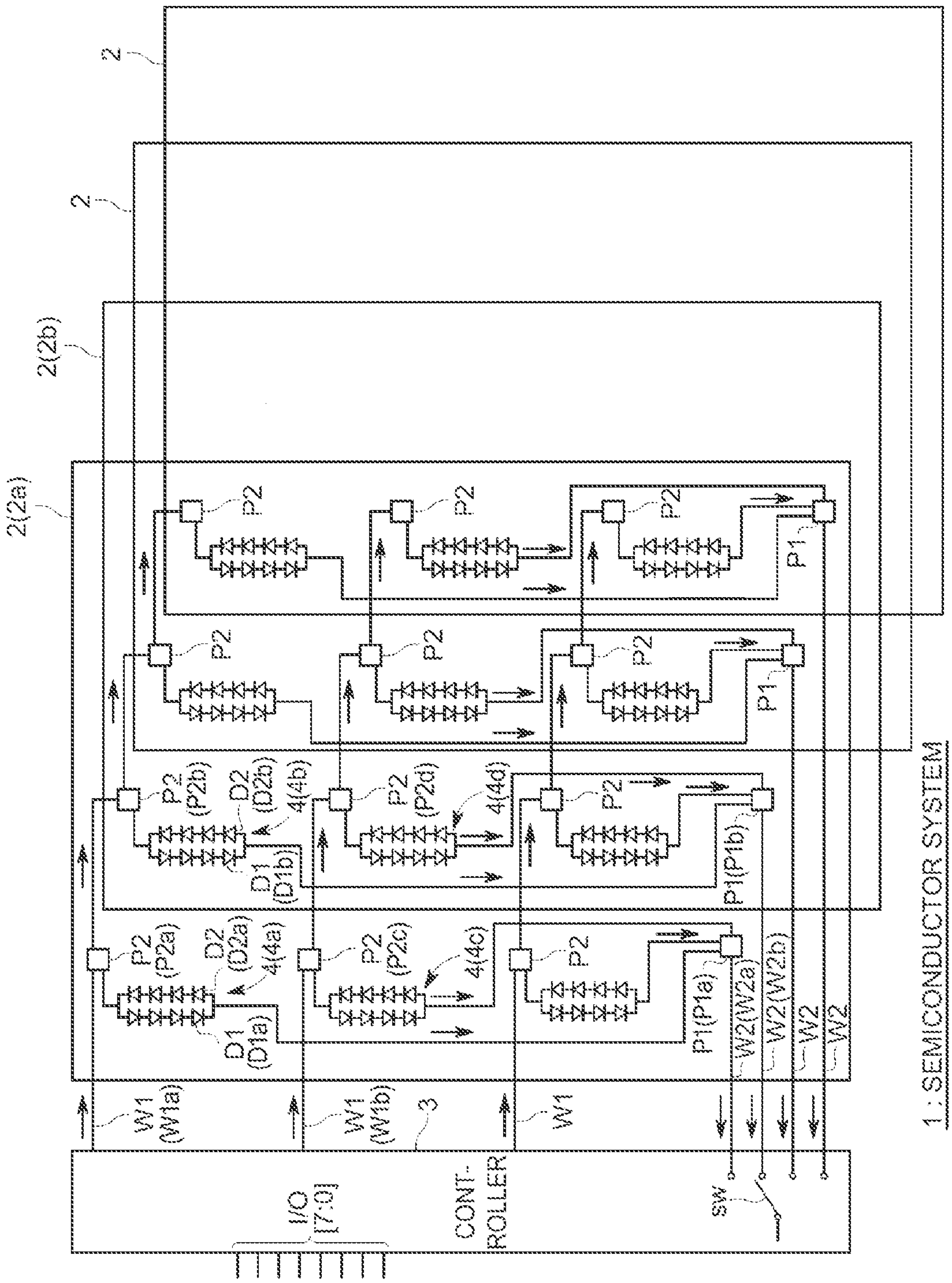
FIG. 1 is a plan view schematically illustrating main components of a semiconductor system according to a first embodiment.

FIG. 1 is a plan view schematically illustrating main components of a semiconductor system 1 according to a first embodiment. The semiconductor system 1 of FIG. 1 is provided with a plurality of stacked semiconductor chips 2, and a controller 3 that controls the plurality of semiconductor chips 2.

Each of the plurality of semiconductor chips 2 is an unpackaged bare chip. The semiconductor chip 2 may be of any type. For example, the semiconductor chip 2 may be a flash memory chip.

Each of the plurality of stacked semiconductor chips 2 is provided with a plurality of pads P1 and P2. In FIG. 1, it is assumed that the plurality of semiconductor chips 2 have the same function, and the positions, the sizes, and the number of pads P1 and P2 provided on each semiconductor chip 2 are common in all of the semiconductor chips 2. Each semiconductor chip 2 transmits/receives signals to/from the controller 3 through the pads P1 and P2 and bonding wires W1 and W2. As described later, each semiconductor chip 2 includes the two types of pads P1 and P2. As to the number of pads, each semiconductor chip 2 is provided with one pad P1 and one or more pads P2. FIG. 1 represents an example in which each semiconductor chip 2 is provided with a plurality of pads P2.

The plurality of pads P2 of each semiconductor chip 2 include a pad for receiving a signal from the controller 3, a pad for transmitting a signal to the controller 3, a pad for bi-directionally transmitting/receiving a signal to/from the controller 3, and a pad for supply a power. Further, the pad P1 provided singularly on each semiconductor chip 2 is a pad for detecting a defect as described later.

As illustrated in FIG. 1, the plurality of semiconductor chips 2 are stacked on a support substrate (not illustrated) while being slightly shifted. The reason for the shifting is to facilitate the connection of the bonding wires W1 and W2 to the pads P1 and P2 on each semiconductor chip 2. When the bonding wires W1 and W2 are connected to the pads P1 and P2 on each of the plurality of semiconductor chips 2, it becomes difficult to secure the space for arranging the bonding wires W1 and W2 as the number of stacked semiconductor chips 2 increases. Thus, in some embodiments, the same type of pads on the plurality of stacked semiconductor chips 2 are bonded to each other in the stacking direction by using through silicon vias (TSV), bumps, a Cu—Cu connection or the like, and the bonding wires W1 are connected to the pads of any one semiconductor chip 2 to transmit/receive signals to/from the controller 3. As a result, without increasing the number of bonding wires W1, signals may be transmitted/received between the controller 3 and the plurality of semiconductor chips 2. Accordingly, the number of stacked semiconductor chips 2 may be increased as needed.

In FIG. 1, the corresponding pads P1 (or P2) of the plurality of stacked semiconductor chips 2 are electrically conducted with each other by wires. However, the diagonal lines are schematic, and are actually implemented by a combination of, for example, vias, a Cu—Cu connection, a wiring pattern and others.

While FIG. 1 represents an example in which each semiconductor chip 2 includes three pads P2. However, the number of pads P2, the arrangement locations of the pads P1 and P2, and the type of signals transmitted/received by the pads P2 are arbitrary. For example, when the semiconductor chip 2 is a flash memory chip, all the pads other than the pad related to a power basically transmit/receive signals to/from the controller 3. The typical pads in the flash memory chip include a pad for a chip enable signal CEn, a pad for a write enable signal WEn, a pad for a read enable signal REn, a pad for an address latch enable signal ALE, a pad for a command latch enable signal CLE and others. The chip enable signal CEn is a signal for bringing the flash memory chip into an enabled state. The write enable signal WEn is a signal for designating a timing for writing data to the flash memory chip. The read enable signal REn is a signal for designating a timing for reading data from the flash memory chip. The address latch enable signal ALE is a signal for indicating that a signal DQ is an address. The command latch enable signal CLE is a signal for indicating that the signal DQ is a command.

As described above, the number and the type of pads P2 provided on each of the plurality of stacked semiconductor chips 2 are arbitrary, and the pads P2 on any one of the plurality of semiconductor chips 2 and the controller 3 are connected to each other by the bonding wires W1. For example, the plurality of pads P2 of the semiconductor chip 2 disposed on the uppermost layer may be connected to the controller 3 by the bonding wires W1, respectively. Additionally, as illustrated in FIG. 1, since the plurality of semiconductor chips 2 are stacked while being shifted, the semiconductor chip 2 having the pads P2 to which the bonding wires W1 are connected may not necessarily be the semiconductor chip disposed on the uppermost layer.

In the descriptions herein, the bonding wire W1 for transmitting a signal between each of the plurality of semiconductor chips 2 and the controller 3 will be referred to as a first wiring W1, and the bonding wire W2 for connecting the controller 3 and each semiconductor chip 2 to each other in order to detect a defect in the first wiring W1 will be referred to as a second wiring W2. The first wiring W1 is provided as many as the number of a plurality of types of pads P2 provided on each of the plurality of stacked semiconductor chips 2. The second wiring W2 is provided as many as the number of stacked semiconductor chips 2.

Further, in the descriptions herein, the pad P1 on the semiconductor chip 2 connected to each of the plurality of second wirings W2 may be referred to as a first pad P1, and the pad P2 electrically conducted with the first wiring W1 may be referred to as a second pad P2. While the second pad P2 is a conventional pad provided on the semiconductor chip 2, the first pad P1 is a non-conventional pad that is provided for detecting a defect. The first pad P1 is provided for each semiconductor chip 2, and connected to the corresponding second wiring W2. One or more second pads P2 are provided on each semiconductor chip 2, and the first wirings W1 are connected to the second pads P2 of any one of the semiconductor chips 2.

As described above, the semiconductor system 1 according to the present embodiment is provided with at least one first wiring W1 and the plurality of second wirings W2, in addition to the plurality of semiconductor chips 2 and the controller 3 described above, for the minimum configuration. The first wirings W1 are wirings (bonding wires) for transmitting signals between the controller 3 and the plurality of semiconductor chips 2. The plurality of second wirings W2 are wirings (bonding wires) for connecting the controller 3 and the first pads P1 of the plurality of semiconductor chips 2 to each other, and return currents flowing through the first wirings W1 to the controller 3 when a defect detection is performed.

The controller 3 is provided therein with a switch SW that selects one of the plurality of second wirings W2. Based on the current flowing through one second wiring W2 selected by the switch SW, the controller 3 detects a defect of the first wiring W1 connected to the second wiring W2. More precisely, the defect of the first wiring W1 refers to a defect in a signal path from the end of the first wiring W1 at the controller 3 side to the second pad P2 of each semiconductor chip 2 through the first wiring W1. A typical example of the defect is a short circuit or a disconnection.

As described later, in the present embodiment, when the controller 3 sends a signal to the second pad P2 of each semiconductor chip 2 through the first wiring W1, the current corresponding to the signal is returned to the controller 3 from the first pad P1 through the second wiring W2. When each semiconductor chip 2 has a plurality of second pads P2, the controller 3 may select an arbitrary second pad P2, according to an input signal to the controller 3 or an address signal for selecting an arbitrary first wiring W1 after a first mode to be described later is selected, and may detect a defect of the first wiring W1 connected to the selected second pad P2.

Since the second wiring W2 is provided separately for each semiconductor chip 2, the controller 3 may identify a semiconductor chip 2 having a signal path in which a defect is occurring, from the current returned through the second wiring W2.

The controller 3 may control the plurality of stacked semiconductor chips 2 by performing a switching between the first mode and a second mode. The first mode is a mode for detecting a defect in the first wiring W1 for the signal transmission. When the first mode is selected, the controller 3 detects the currents returned through the plurality of second wirings W2, and detects whether a defect occurs in the signal paths of the plurality of respective semiconductor chips 2, based on the detected currents. More specifically, in the first mode, the controller 3 detects the current that flows from a first wiring W1 to a corresponding second wiring W2 via a first pad P1 corresponding to any one second pad P2.

When the second mode is selected, the signal paths in which currents flow from the first wirings W1 to the plurality of second wirings W2 are cut off. Accordingly, the controller 3 transmits signals to/from each semiconductor chip 2 through the first wirings W1, to cause each semiconductor chip 2 to perform a normal operation.

As described above, one end of each first wiring W1 is connected to the controller 3, and the other end thereof is connected to a second pad P2 of any one of the semiconductor chips 2. The plurality of second pads P2 provided on each of the plurality of semiconductor chips 2 are electrically conducted with each other. During the defect detection, the current flowing from the first wiring W1 to each of the plurality of second pads P2 flow to the corresponding second wiring W2 through the corresponding first pad P1.

As illustrated in FIG. 1, each of the plurality of semiconductor chips 2 is provided with a rectification circuit 4 disposed between the first pad P1 and the second pad P2. When the voltage level of the first wiring W1 is less than a predetermined threshold value, the rectification circuit 4 cuts off the signal path in which a current flows from the second pad P2 to the first pad P1, and when the voltage level of the first wiring W1 is equal to or higher than the threshold value, the rectification circuit 4 allows the current to flow in the signal path from the second pad P2 to the first pad P1. The predetermined threshold value is, for example, a voltage higher than the power supply voltage of the semiconductor chip 2. As a result, when the controller 3 sets the voltage level of the first wiring W1 to be less than the predetermined threshold value (the second mode described above), the current does not flow from the first wiring W1 to the first pad P1 through the second pad P2, and thus, does not also flow in the second wiring W2, so that the controller 3 does not need to monitor the current of the second wiring W2. Meanwhile, in the first mode, the controller 3 intentionally sets the voltage level of the first wiring W1 to be equal to or higher than the predetermined threshold value, such that a current flows from the first wiring W1 to the second wiring W2 through the second pad P2 and the first pad P1.

As described above, in the first mode, the voltage level of the first wiring W1 needs to be set to the predetermined threshold value or higher. Thus, for example, a voltage boosting circuit (not illustrated) may be provided inside the controller 3, to supply a voltage obtained by boosting the power voltage of the controller 3 with the voltage boosting circuit, to the first wiring W1 during the first mode. Alternatively, the voltage for the first mode may be input in advance to the controller 3, and the input voltage for the first mode may be supplied to the first wiring W1 during the first mode.

By providing the rectification circuit 4 in this way, the current may flow from the first wiring W1 to the second wiring W2 through the rectification circuit 4, only when the controller 3 increases the voltage level of the first wiring W1. Accordingly, by monitoring the current of the second wiring W2, the controller 3 may perform the defect detection for the first wiring W1 of which voltage level has been increased.

The rectification circuit 4 has a plurality of first diodes D1 connected in series while aligning the rectification directions thereof. The anode of the first diode D1 at one end of the plurality of connected first diodes D1 is connected to the second pad P2. The cathode of the first diode D1 at the other end of the plurality of connected first diodes D1 is connected to the first pad P1. Since the forward voltage of a normal diode is about 0.6 V, the number of diodes connected in series is set to be, for example, four, when the power voltage of the semiconductor chip 2 is, for example, about 1.8 V. As a result, the above-described predetermined threshold value is set to about 2.4 V, and when the voltage level of the first wiring W1 is 2.4 V or more, the current may be allowed to flow from the first wiring W1 to the second wiring W2 through the diodes D1.

An example has been described in which the current flows from the first wiring W1 to the second wiring W2 through the rectification circuit 4. However, according to the type of defect, a defect may not be correctly detected by simply monitoring the current of the second wiring W2, and may be detected by returning the current from the second wiring W2 to the first wiring W1 through the rectification circuit 4. Thus, when the voltage levels of the plurality of second wirings W2 are less than a predetermined threshold value, the rectification circuit 4 cuts off the signal paths in which the current flows from the plurality of first pads P1 to the corresponding second pads P2. When the voltage level of at least one of the plurality of second wirings W2 is equal to or higher than the threshold value, the rectification circuit 4 allows the current to flow in the signal path from at least one of the plurality of first pads P1 to the corresponding second pads P2. In this case, the rectification circuit 4 has a plurality of second diodes D2 connected in series in the opposite direction to that of the plurality of first diodes D1. The cathode of the second diode D2 at one end of the plurality of connected second diodes D2 is connected to the second pad P2. The anode of the second diode D2 at the other end of the plurality of connected second diodes D2 is connected to the first pad P1.

As illustrated in FIG. 1, each semiconductor chip 2 is provided with the plurality of types of second pads P2 for transmitting signals with respect to the controller 3. In this case, the plurality of first wirings W1 are arranged between the controller 3 and the plurality of semiconductor chips 2 to be electrically conducted with the plurality of types of second pads P2. During the defect detection, the controller 3 detects the current flowing from each first wiring W1 to the corresponding second wiring W2 through the corresponding second pad P2 and the corresponding first pad P1. The rectification circuit 4 is separately connected to each of the plurality of first wirings W1. When the voltage level of the second wiring W2 is less than a predetermined threshold value, each rectification circuit 4 cuts off the signal path in which a current flows from the corresponding second pad P2 to the first pad P1. When the voltage level of the second wiring W2 is equal to or higher than the threshold value, each rectification circuit 4 allows the current to flow in the signal path from the corresponding second pad P2 to the corresponding first pad P1. Further, when the voltage levels of the plurality of second wirings W2 are less than a predetermined threshold value, each rectification circuit 4 cuts off the signal path in which a current flows from each of the plurality of first pads P1 to the corresponding second pad P2. When the voltage level of at least one of the plurality of second wirings W2 is equal to or higher than the threshold value, each rectification circuit 4 may allow the current to flow in the signal path from at least one of the plurality of first pads P1 to the corresponding second pad P2.

A stacking technique by which semiconductor chips are stacked, connected to each other through bonding wires and packaged, has become widely used. In a case where the number of stacked semiconductor chips is large, the number of wires in the package becomes excessively large, when the bonding wires are connected to the pads of each stacked semiconductor chip. Thus, for the same type of signals, the pads of the plurality of semiconductor chips may be conducted with each other in the stacking direction, and bonding wires may be connected only to the pads of a representative semiconductor chip, thereby reducing the number of wires. In this case, when a defect is detected in a signal transmitted from the controller to a bonding wire, it is difficult to identify the defective location from the outside of the package.

The semiconductor system 1 illustrated in FIG. 1 may be provided with the controller 3 and two semiconductor chips 2, for the minimum configuration. Hereinafter, the two semiconductor chips 2 will be referred to as a first semiconductor chip 2*a* and a second semiconductor chip 2*b*. For example, each of the first semiconductor chip 2*a* and the second semiconductor chip 2*b* has one first pad P1 and two second pads P2. In the descriptions herein below, the two second pads P2 in the first semiconductor chip 2*a* will be referred to as a third pad P2*a* and a fifth pad P2*c*, and the two second pads P2 in the second semiconductor chip 2*b* will be referred to as a fourth pad P2*b* and a sixth pad P2*d*.

As described above, the controller 3 and each semiconductor chip 2 perform the signal transmission through the first wiring W1. In the descriptions hereinafter, the first wiring W1 for transmitting a first signal between the controller 3, and the third pad P2*a* in the first semiconductor chip 2*a*/the fourth pad P2*b* in the second semiconductor chip 2*b* will be referred to as a first wiring W1*a*, and the first wiring W1 for transmitting a second signal different from the first signal between the controller 3 and the fifth pad P2*c* in the first semiconductor chip 2*a*/the sixth pad P2*d* in the second semiconductor chip 2*b* will be referred to as a fourth wiring W1*b*.

As described above, each semiconductor chip 2 in the semiconductor system 1 illustrated in FIG. 1 has the first pad P1 and the second wiring W2. Hereinafter, the first pad P1 in the first semiconductor chip 2*a* will be referred to as a first pad P1*a*, and the second wiring W2 connected to the first pad P1*a* will be referred to as a second wiring W2*a*. Further, the first pad P1 in the second semiconductor chip 2*b* will be referred to as a second pad P1*b*, and the second wiring W2 connected to the second pad P1*b* will be referred to as a third wiring W2*b*.

As described above, each semiconductor chip 2 in the semiconductor system illustrated in FIG. 1 has the rectification circuits 4. Hereinafter, the rectification circuit 4 disposed between the first pad P1*a* and the third pad P2*a* in the first semiconductor chip 2*a* will be referred to as a first rectification circuit 4*a*, and the rectification circuit 4 disposed between the second pad P1*b* and the fourth pad P2*b* in the second semiconductor chip 2*b* will be referred to as a second rectification circuit 4*b*. Further, the rectification circuit 4 disposed between the first pad P1*a* and the fifth pad P2*c* in the first semiconductor chip 2*a* will be referred to as a third rectification circuit 4*c*, and the rectification circuit 4 disposed between the second pad P1*b* and the sixth pad P2*d* in the second semiconductor chip 2*b* will be referred to as a fourth rectification circuit 4*d*.

As described above, the rectification circuit 4 of FIG. 1 has the plurality of diodes D1 and the plurality of diodes D2 which are different from each other in direction. Hereinafter, the plurality of diodes D1 in the first rectification circuit 4*a* will be referred to as a plurality of first diodes D1*a*, and the plurality of diodes D1 in the second rectification circuit 4*b* will be referred to as a plurality of second diodes D1*b*. Further, hereinafter, the plurality of diodes D2 in the first rectification circuit 4*a* will be referred to as a plurality of third diodes D2*a*, and the plurality of diodes D2 in the second rectification circuit 4*b* will be referred to as a plurality of fourth diodes D2*b*.

As described above, the first semiconductor chip 2*a* is provided with the first pad P1*a*, the third pad P2*a*, the fifth pad P2*c*, the first rectification circuit 4*a* having the plurality of first diodes D1*a* and the plurality of third diodes D2*a*, and the third rectification circuit 4*c* having the same configuration as that of the first rectification circuit 4*a*. The second semiconductor chip 2*b* is provided with the second pad P1*b*, the fourth pad P2*b*, the sixth pad P2*d*, the second rectification circuit 4*b* having the plurality of second diodes Dib and the plurality of fourth diodes D2*b*, and the fourth rectification circuit 4*d* having the same configuration as that of the second rectification circuit 4*b*. The controller 3 transmits the first signal to the first semiconductor chip 2*a* and the second semiconductor chip 2*b* through the first wiring W1*a*. The first semiconductor chip 2*a* returns the current flowing in the first wiring W1*a* to the controller 3 through the second wiring W2*a*. The second semiconductor chip 2*b* returns the current flowing in the first wiring W1*a* to the controller 3 through the third wiring W2*b*. Further, the controller 3 transmits the second signal to the first semiconductor chip 2*a* and the second semiconductor chip 2*b* through the fourth wiring W1*b*. The first semiconductor chip 2*a* returns the current flowing in the fourth wiring W1*b* to the controller 3 through the second wiring W2*a*. The second semiconductor chip 2*b* returns the current flowing in the fourth wiring W1*b* to the controller 3 through the third wiring W2*b*.

In the semiconductor system 1 according to the first embodiment, in order to detect a defect in the first wiring W1 for transmitting a signal between the plurality of stacked semiconductor chips 2 and the controller 3, the second wiring W2 for connecting the first pad P1 of each semiconductor chip and the controller 3 to each other is provided. Then, the current corresponding to the signal sent by the controller 3 to the first wiring W1 is returned to the controller 3 from each second wiring W2. As a result, a defect such as a short circuit or disconnection in the signal path from the end of the first wiring W1 at the controller 3 side to the second pad P2 of each semiconductor chip 2 may be individually detected for each semiconductor chip 2. Thus, according to the present embodiment, the defective location in the wiring path between the plurality of stacked semiconductor chips 2 and the controller 3 may be easily and accurately identified.

Further, in the present embodiment, since the plurality of rectification circuits 4 are provided between the first wirings W1 and the plurality of second wiring W2, a current flows from the first wirings W1 to the second wirings W2 only when the controller 3 supplies a signal having a voltage level equal to or higher than the predetermined threshold value to the first wirings W1. Thus, by simply switching the voltage level of the first wirings W1 without providing the switching circuit for switching the operation mode, a switching may be implemented between the first mode for detecting a defect of the first wirings W1 and the second mode for normally operating the plurality of semiconductor chips 2.

Second Embodiment

Figure 2:
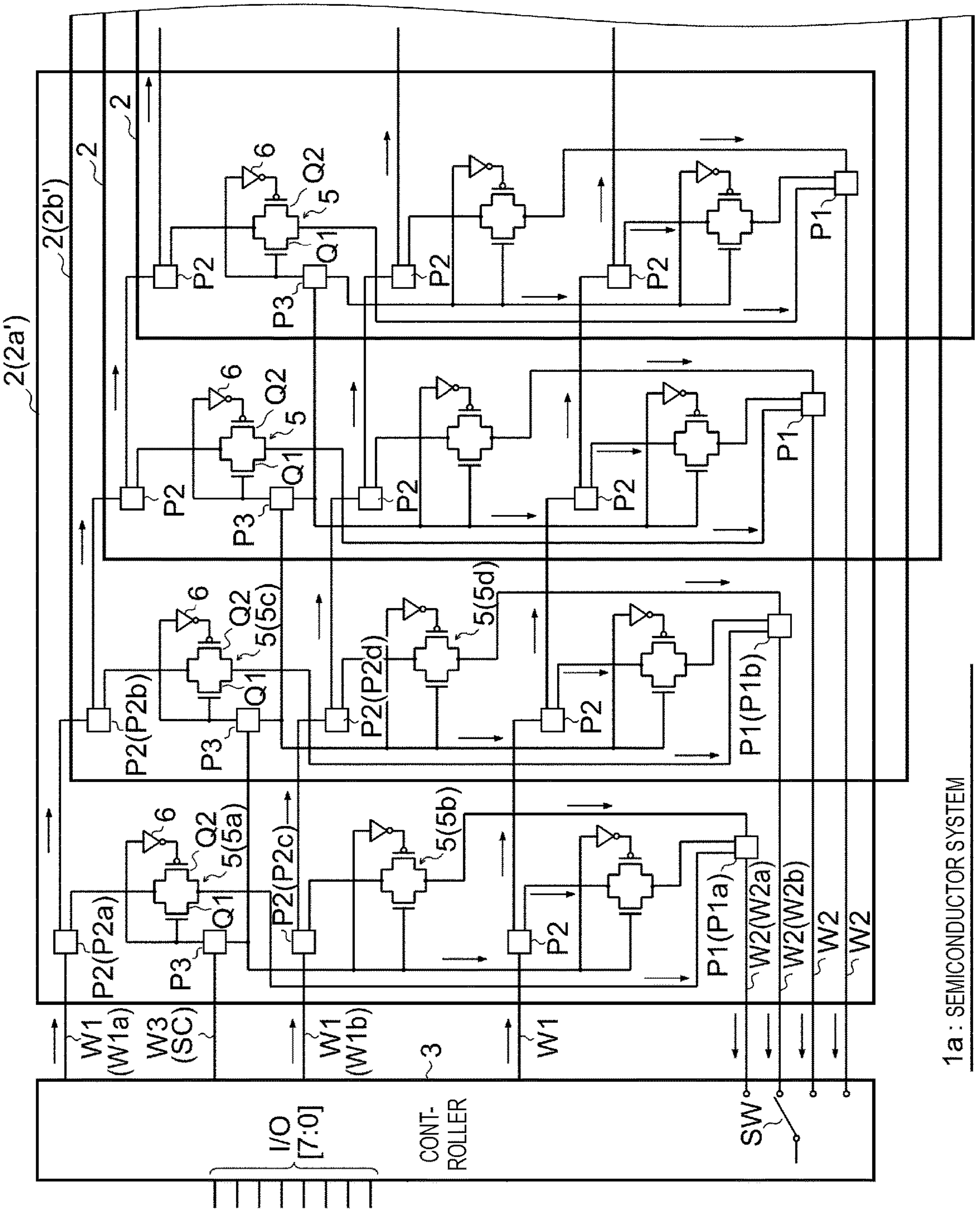
FIG. 2 is a plan view schematically illustrating main components of a semiconductor system according to a second embodiment.

In a second embodiment, switching circuits 5 are provided, instead of the rectification circuits 4 of FIG. 1. FIG. 2 is a plan view schematically illustrating main components of a semiconductor system 1*a* according to the second embodiment. Similarly to FIG. 1, the semiconductor system 1*a* of FIG. 2 is provided with the plurality of stacked semiconductor chips 2 and the controller 3.

As illustrated in FIG. 2, each of the plurality of semiconductor chips 2 has a plurality of switching circuits 5 that switches whether or not the plurality of types of the second pads P2 and the first pad P1 are electrically conducted with each other. The controller 3 selects one of the plurality of switching circuits 5 to electrically conduct the corresponding second pad P2 and the first pad P1 with each other, thereby detecting the current flowing through the first pad P1.

The plurality of switching circuits 5 switch whether or not the corresponding second pad P2 and the first pad P1 are electrically conducted with each other, based on a switching control signal SC from the controller 3. Between the controller 3 and the plurality of semiconductor chips 2, the plurality of first wirings W1 and the plurality of second wirings W2 are arranged as in the semiconductor system 1 of the first embodiment, and furthermore, a third wiring W3 for the switching control signal SC is disposed. Since the switching control signal SC is able to perform the switching control for all of the switching circuits 5, only one third wiring W3 may be provided. By switching the logic of the switching control signal SC, the controller 3 may switch whether or not the second pads P2 corresponding to all of the switching circuits 5 and the first pad P1 are electrically conducted with each other. More specifically, the controller 3 may set the switching control signal SC to, for example, a high level, so that through each switching circuit 5, a corresponding second pad P2 and the first pad P1 may be electrically conducted with each other. In this case, the current corresponding to the signal on the first wiring W1 connected to the second pad P2 flows to the corresponding second wiring W2 through the second pad P2 and the first pad P1.

Since the controller 3 may individually control the voltages applied to the plurality of first wirings W1, a defect such as a disconnection or the like in each first wiring W1 may be individually detected. In the first embodiment, a signal having a voltage level equal to or higher than the predetermined threshold value is supplied to the plurality of first wirings W1 in the first mode. However, in the present embodiment, there is no difference in the voltage level of the signal supplied to the plurality of first wirings W1 during the first and second modes. Thus, the control at the controller 3 side is facilitated.

The specific circuit configuration of the plurality of switching circuits 5 is not limited to any particular configuration. The example of FIG. 2 has an NMOS transistor Q1 and a PMOS transistor Q2 connected in parallel between the first pad P1 and the second pad P2, and an inverter 6. The switching control signal SC is input to the inverter 6, and the output of the inverter 6 is input to the gate of the PMOS transistor Q2. The switching control signal SC is input to the gate of the NMOS transistor Q1.

The semiconductor system 1*a* illustrated in FIG. 2 may be provided with the controller 3 and the two semiconductor chips 2, for the minimum configuration. Hereinafter, the two semiconductor chips 2 will be referred to as a first semiconductor chip 2*a*' and a second semiconductor chip 2*b*'. Hereinafter, descriptions will be made focusing on the differences from the first semiconductor chip 2*a* and the second semiconductor chip 2*b* in FIG. 1.

The first semiconductor chip 2*a*' has a first switching circuit 5*a* and a second switching circuit 5*b*, instead of the first rectification circuit 4*a* and the third rectification circuit 4*c* in the first semiconductor chip 2*a* of FIG. 1. Further, the second semiconductor chip 2*b*' has a third switching circuit 5*c* and a fourth switching circuit 5*d*, instead of the second rectification circuit 4*b* and the fourth rectification circuit 4*d* in the first semiconductor chip 2*b* of FIG. 1. The first switching circuit 5*a* switches whether or not the first pad P1*a* and the third pad P2*a* are electrically conducted with each other. The second switching circuit 5*b* switches whether or not the first pad P1*a* and the fifth pad P2*c* are electrically conducted with each other. The third switching circuit 5*c* switches whether or not the second pad P1*b* and the fourth pad P2*b* are electrically conducted with each other. The fourth switching circuit 5*d* switches whether or not the second pad P1*b* and the sixth pad P2*d* are electrically conducted with each other. The controller 3 brings the first switching circuit 5*a* into a conducting state to electrically conduct the third pad P2*a* and the first pad P1*a* with each other, thereby detecting the current flowing through the first pad P1*a*. The controller 3 brings the second switching circuit 5*b* into the conducting state to electrically conduct the fifth pad P2*c* and the first pad P1*a* with each other, thereby detecting the current flowing through the first pad P1*a*. The controller 3 brings the third switching circuit 5*c* into the conducting state to electrically conduct the fourth pad P2*b* and the second pad P1*b* with each other, thereby detecting the current flowing through the second pad P1*b*. The controller 3 brings the fourth switching circuit 5*d* into the conducting state to electrically conduct the sixth pad P2*d* and the second pad P1*b* with each other, thereby detecting the current flowing through the second pad P1*b*.

As described above, in the second embodiment, the plurality of switching circuits 5 are provided between the plurality of second pads P2 electrically connected to the plurality of first wirings W1 arranged for the signal transmission between the controller 3 and the plurality of semiconductor chips 2, and the first pad P1. The controller 3 selects one of the plurality of switching circuits 5 by the switching control signal SC, and returns the current from the corresponding first wiring W1 to the second wiring W2 through the selected switching circuit 5.

In the second embodiment, since the switching circuit 5 switches whether or not the first pad P1 and the second pad P2 are electrically conducted with each other, the voltage levels of the plurality of first wirings W1 during the first mode do not need to be boosted to be higher than that in the second mode, so that the internal configuration and the control of the controller 3 may not become complicated.

Further, in FIG. 2, the switching control for all of the switching circuits 5 is performed based on the common switching control signal SC output from the controller 3.

However, a separate switching control signal SC may be formed for each switching circuit 5. In this case, a number of third wirings W3 equal to the number of switching circuits 5 are arranged between the controller 3 and the plurality of semiconductor chips 2, and through each third wiring W3, the corresponding switching control signal SC is supplied to each semiconductor chip 2.

NAND flash memory chips may be used as the plurality of stacked semiconductor chips 2 in the semiconductor systems 1 and 1*a* according to the first and second embodiments described above.

Figure 3:
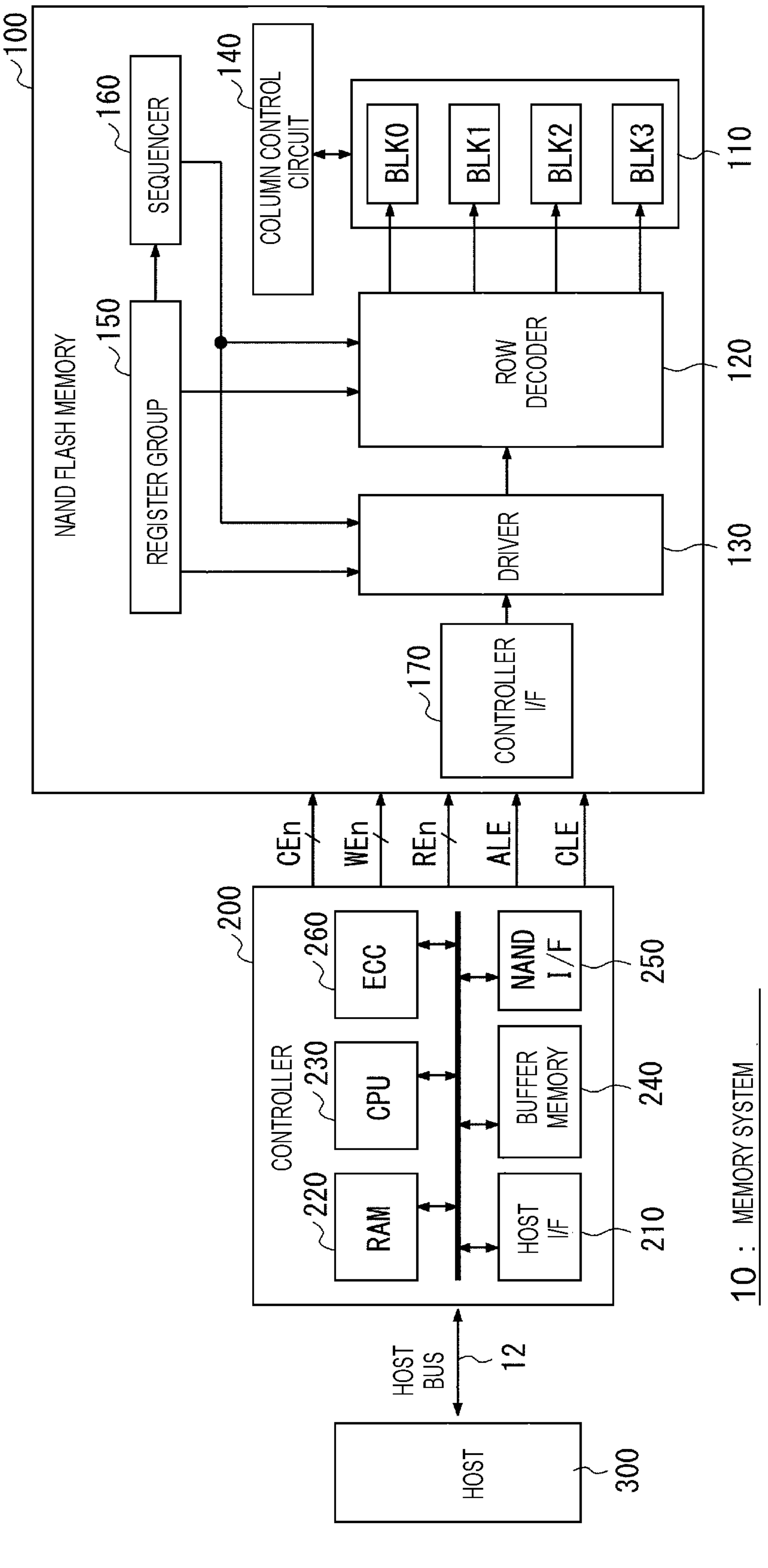
FIG. 3 is a block diagram illustrating an outline of a memory system which is a specific example of the semiconductor systems according to the first and second embodiments.

FIG. 3 is a block diagram illustrating an outline of a memory system 10 which is a specific example of the semiconductor system 1 or 1*a* according to the first or second embodiment. The memory system 10 of FIG. 3 is provided with a NAND flash memory 100, a controller 200, and a host device 300. The NAND flash memory 100 is a stacked body in which a plurality of NAND flash memory chips is stacked.

Each of the plurality of flash memory chips that make up the NAND flash memory 100 has a memory cell array 110. Each memory cell in the memory cell array 110 stores data in a nonvolatile manner. All of the plurality of flash memory chips have the same internal configuration. Further, each flash memory chip has a controller interface (I/F) circuit 170. As illustrated in FIGS. 1 and 2, the plurality of second pads P2, the rectification circuits 4 or the switching circuits 5, and the first pad P1 are provided in the controller I/F circuit 170. The second wiring W2 and the first pad P1 are provided for each flash memory chip. Further, in the controller I/F circuit 170, the third pad P3 of FIG. 2 may be provided, and the third wiring W3 may be provided to be connected to the third pad P3.

The controller 200 transmits/receives various signals to/from the NAND flash memory 100. Further, the controller 200 is connected to the host device 300 by a host bus 12.

The controller 200 and the NAND flash memory 100 are connected to each other by the plurality of first wirings W1 and the plurality of second wirings W2 for transmitting/receiving various signals. As described above, the plurality of first wirings W1 transmit/receive the chip enable signal CEn, the write enable signal WEn, the read enable signal REn, the address latch enable signal ALE, the command latch enable signal CLE and others.

The controller 200 controls the NAND flash memory 100, and accesses the NAND flash memory 100 in response to a command received from the host device 300. The host device 300 is, for example, an electronic device such as a personal computer or the like.

The controller 200 is provided with a host interface (I/F) circuit 210, a built-in memory (random access memory (RAM)) 220, a processor (central processing unit (CPU)) 230, a buffer memory 240, a NAND interface (I/F) circuit 250, and an error checking and correcting (ECC) circuit 260.

The host I/F circuit 210 is connected to the host device 300 via the host bus 12, and transfers commands and data received from the host device 300 to each of the CPU 230 and the buffer memory 240. Further, in response to a command from the CPU 230, the host I/F circuit 210 transfers data in the buffer memory 240 to the host device 300.

The CPU 230 controls the operation of the entire controller 200. For example, when a write command is received from the host device 300, the CPU 230 issues a write command to the NAND I/F circuit 250 in response. The same applies to a read command and an erase command. Further, the CPU 230 executes various processes for managing the NAND flash memory 100, such as wear leveling or the like. Additionally, the operation of the controller 200 described below may be implemented in the manner that the CPU executes firmware, or may be implemented by hardware.

The NAND I/F circuit 250 transmits/receives various signals to/from the controller I/F circuit 170 in the NAND flash memory 100, so as to carry out communication with the NAND flash memory 100. Further, the NAND I/F circuit 250 transmits various signals to the NAND flash memory 100, and receives various signals from the NAND flash memory 100, based on commands received from the CPU 230. The buffer memory 240 temporarily stores write or read data.

The RAM 220 is a semiconductor memory such as a dynamic random access memory (DRAM), a static random access memory (SRAM) or the like, and is used as a work area of the CPU 230. The RAM 220 stores firmware for managing the NAND flash memory 100, various management tables and others.

The ECC circuit 260 performs an error detecting process and an error correcting process on data to be stored in the NAND flash memory 100. That is, for a data write, the ECC circuit 260 generates an error correction code (ECC), and assigns the generated ECC to write data. For a data read, the ECC circuit 260 determines whether an error exists in read data, and when it is determined that an error exists in the read data, the ECC circuit 260 performs the error correcting process on the read data by using the ECC.

Next, the configuration of the NAND flash memory 100 will be described. As described above, the NAND flash memory 100 is provided with the memory cell array 110, a row decoder 120, a driver circuit 130, a column control circuit 140, a register group 150, and a sequencer 160, in addition to the controller I/F circuit 170.

The memory cell array 110 is provided with a plurality of blocks BLK that includes a plurality of nonvolatile memory cells associated with rows and columns. FIG. 3 illustrates, for example, four blocks BLK0 to BLK3. Then, the memory cell array 110 stores data transferred from the controller 200.

The row decoder 120 selects one of the blocks BLK0 to BLK3, and further, selects a row direction in the selected block BLK. The driver circuit 130 supplies a voltage to the selected block BLK via the row decoder 120.

During the data read, the column control circuit 140 senses data read from the memory cell array 110, and performs a necessary arithmetic operation. Then, the column control circuit 140 outputs the data to the controller 200. During the data write, the column control circuit 140 transfers write data received from the controller 200, to the memory cell array 110.

The register group 150 has an address register, a command register and others. The address register stores an address received from the controller 200. The command register stores a command received from the controller 200.

The sequencer 160 controls the operation of the entire NAND flash memory 100, based on various types of information stored in the register group 150.

As illustrated in FIG. 1 or 2, the NAND flash memory 100 of FIG. 3 is configured with a plurality of stacked flash memory chips. By increasing the number of stacked layers, the memory capacity of the NAND flash memory 100 may be increased.

Figure 4:
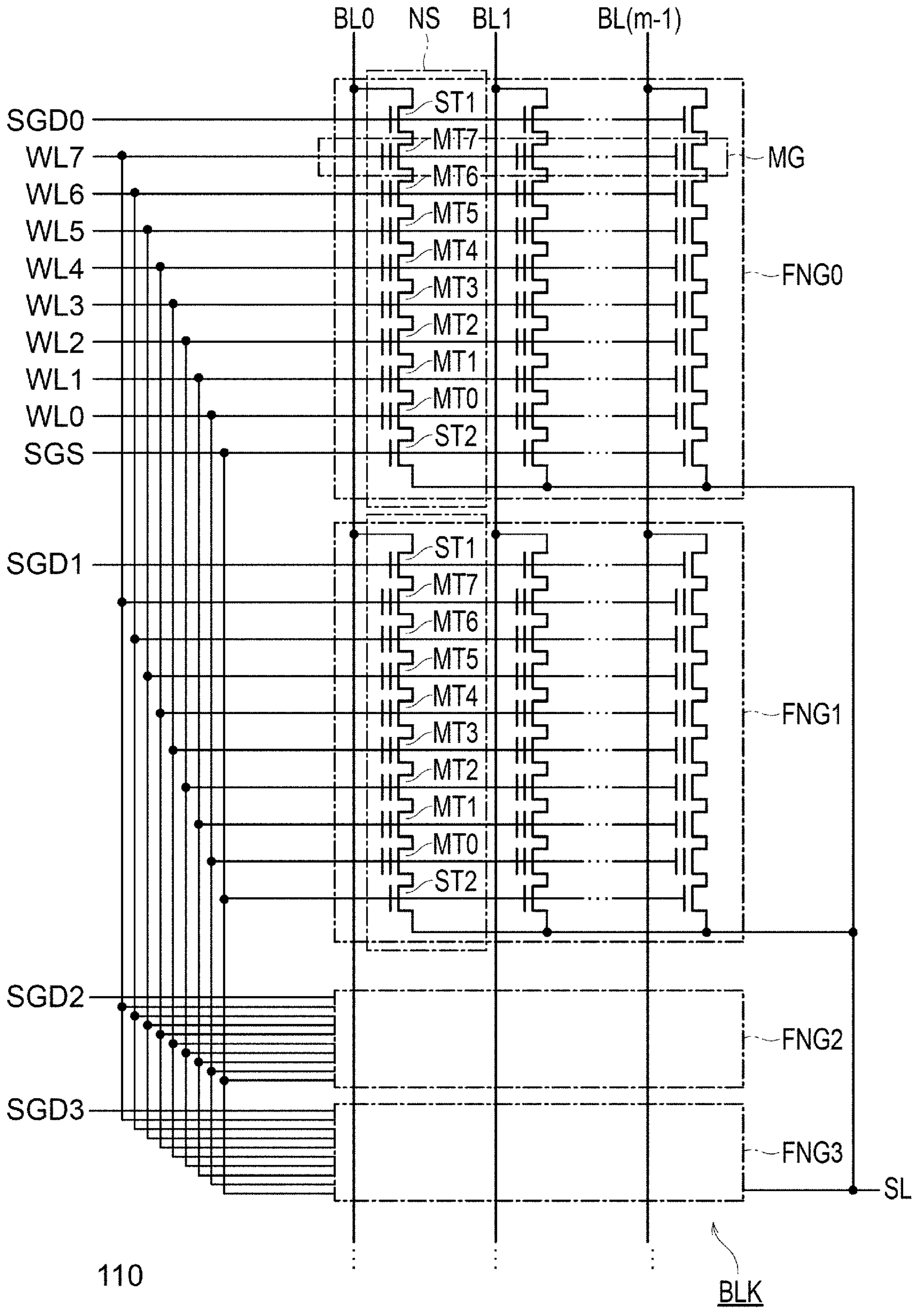
FIG. 4 is a circuit diagram illustrating an example of a NAND flash memory cell array having a three-dimensional structure.

FIG. 4 is a circuit diagram illustrating an example of the NAND flash memory cell array 110 having the three-dimensional structure. FIG. 4 represents a circuit configuration of one block BLK among the plurality of blocks in the NAND flash memory cell array 110 having the three-dimensional structure. The other blocks of the NAND flash memory cell array 110 have the same circuit configuration as illustrated in FIG. 4.

As illustrated in FIG. 4, the block BLK has, for example, four fingers FNG (FNG0 to FNG3). Further, each finger FNG includes a plurality of NAND strings NS. Each NAND string NS has, for example, eight memory cell transistors MT (MT0 to MT7) connected in cascade, and select transistors ST1 and ST2. In the descriptions herein, each finger FNG may be referred to as a string unit SU.

Further, the number of memory cell transistors MT in the NAND string NS is not limited to eight. The memory cell transistors MT are arranged such that current paths thereof are connected in series, between the select transistors ST1 and ST2. The current path of the memory cell transistor MT7 at one end of the connection in series is connected to one end of the current path of the select transistor ST1, and the current path of the memory cell transistor MT0 at the other end of the connection in series is connected to one end of the current path of the select transistor ST2.

The gates of the select transistors ST1 in the respective fingers FNG0 to FNG3 are commonly connected to the select gate lines SGD0 to SGD3, respectively. Meanwhile, the gates of the select transistors ST2 are commonly connected to the same select gate line SGS across the plurality of fingers FNG. Further, the control gates of the memory cell transistors MT0 to MT7 in the same block BLK are commonly connected to word lines WL0 to WL7, respectively. That is, while the word lines WL0 to WL7 and the select gate line SGS are commonly connected across the plurality of fingers FNG0 to FNG3 in the same block BLK, the select gate lines SGD are independent for the fingers FNG0 to FNG3, respectively, even in the same block BLK.

The word lines WL0 to WL7 are connected to the control gate electrodes of the memory cell transistors MT0 to MT7 that make up the NAND string NS, respectively, and i-th memory cell transistors MTi (i=0 to 7) in the respective NAND strings NS within the same finger FNG are commonly connected by the same word line WLi (i=0 to 7). That is, the control gate electrodes of the memory cell transistors MTi in the same row of a block BLK are connected to the same word line WLi.

Each NAND string NS is connected to the word line WLi, and is also connected to a bit line. Each memory cell in each NAND string NS may be identified by an address that identifies the word line WLi and the select gate lines SGD0 to SGD3, and an address that identifies the bit line. As described above, data of the memory cells (the memory cell transistors MT) in the same block BLK are collectively erased. Meanwhile, the data reading and the data writing are performed in units of a physical sector MG. One physical sector MG includes a plurality of memory cells connected to one word line WLi and belonging to one finger FNG.

The controller 200 performs the writing (programming) in units of all the NAND strings NS connected to one word line WLi within one finger FNG. Thus, the unit of the data amount in which the controller 200 executes the programming is 4 bits×the number of bit lines.

During the read operation and the programming operation, one word line WLi and one select gate line SGD are selected according to a physical address, and a physical sector MG is selected. In the descriptions herein, writing data to a memory cell is referred to as programming as necessary.

As illustrated in FIGS. 3 and 4, the controller 200 and the NAND flash memory 100 transmit/receive a plurality of signals. Thus, the number of bonding wires between the controller 200 and the NAND flash memory 100 increases. Further, with the miniaturization of each flash memory chip that configures of the NAND flash memory 100, the number of stacked flash memory chips tends to also increase. Thus, when a defect such as a disconnection, a short circuit or the like occurs in a bonding wire from the controller 200, it becomes significantly difficult to identify the defective location.

In the memory system 10 according to the present embodiment, the current corresponding to each signal transmitted/received to/from the plurality of first wirings W1 is returned to the controller 200 from the first pad P1 in each flash memory chip through the second wiring W2, as in the semiconductor systems 1 and 1*a* according to the first and second embodiments, so that the controller 200 may easily and accurately identify whether a defect occurs in an individual first wiring W1.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor system comprising:

a first semiconductor chip;

a second semiconductor chip stacked above the first semiconductor chip;

a controller configured to control the first and second semiconductor chips;

a first wiring connected between the controller and each of the first and second semiconductor chips and by which a first signal is to be transmitted from the controller to each of the first and second semiconductor chips;

a second wiring connected between the controller and each of the first and second semiconductor chips and by which a second signal is to be transmitted from the controller to each of the first and second semiconductor chips;

a third wiring connected between the controller and the first semiconductor chip and by which currents of the first and second signals flowing through the first and second wirings to the first semiconductor chip are to be returned to the controller; and a fourth wiring connected between the controller and the second semiconductor chip and by which currents of the first and second signals flowing through the first and second wirings to the second semiconductor chip are to be returned to the controller, wherein the first semiconductor chip includes a first rectification circuit in a current path between the first wiring and the third wiring, that is configured to cut off the current of the first signal from flowing to the third wiring or allow the current of the first signal to flow to the third wiring, and a second rectification circuit in a current path between the second wiring and the third wiring, that is configured to cut off the current of the second signal from flowing to the third wiring or allow the current of the second signal to flow to the third wiring, and the second semiconductor chip includes a third rectification circuit in a current path between the first wiring and the fourth wiring, that is configured to cut off the current of the first signal from flowing to the fourth wiring or allow the current of the first signal to flow to the fourth wiring, and a fourth rectification circuit in a current path between the second wiring and the fourth wiring, that is configured to cut off the current of the second signal from flowing to the fourth wiring or allow the current of the second signal to flow to the fourth wiring.

2. The semiconductor system according to claim 1, wherein the controller is configured to detect a defect in the first semiconductor chip based on the current flowing through the third wiring and to detect a defect in the second semiconductor chip based on the current flowing through the fourth wiring.

3. The semiconductor system according to claim 1, wherein the controller is configured to set a voltage level supplied to the first and second wirings to be higher in a defect detecting mode of operating the first and second semiconductor chips than in a normal mode of operating the first and second semiconductor chips.

4. The semiconductor system according to claim 1, wherein the first semiconductor chip includes a first pad connected to one end of the third wiring, and the second semiconductor chip includes a second pad connected to one end of the fourth wiring, and during the defect detecting mode, the controller detects the currents flowing from the first and second wirings to the third wiring through the first and second rectification circuits and the first pad, and detects the currents flowing from the first and second wirings to the fourth wiring through the third and fourth rectification circuits and the second pad.

5. The semiconductor system according to claim 4, wherein the first semiconductor chip includes third pads electrically conducted with the first and second wirings, respectively, and the second semiconductor chip includes fourth pads electrically conducted with the first and second wirings, respectively, and during the defect detecting mode, the controller detects the currents flowing from the first and second wirings to the third wiring through the third pads, the first and second rectification circuits, and the first pad, and detects the currents flowing from the first and second wirings to the fourth wiring through the fourth pads, the third and fourth rectification circuits, and the second pad.

6. The semiconductor system according to claim 5, wherein each of the first and second wirings is connected to the controller, one of the third pads and one of the fourth pads, and the currents flowing from the first and second wirings to the third pads of the first semiconductor chip flow to the third wiring through the first and second rectification circuits and the first pad, and the currents flowing from the first and second wirings to the fourth pads of the second semiconductor chip flow to the fourth wiring through the third and fourth rectification circuits and the second pad.

7. The semiconductor system according to claim 1, wherein the first or third rectification circuit is configured to cut off the current flow when the voltage level of the first wiring is less than a first threshold value, and allow the current flow when the voltage level of the first wiring is equal to or higher than the first threshold value, and the second or fourth rectification circuit is configured to cut off the current flow when the voltage level of the second wiring is less than a second threshold value, and allow the current flow when the voltage level of the second wiring is equal to or higher than the second threshold value.

8. The semiconductor system according to claim 7, wherein the first rectification circuit includes a plurality of first diodes having rectification directions aligned in the same direction connected in series.

9. The semiconductor system according to claim 8, wherein the first rectification circuit includes a plurality of third diodes having rectification directions aligned in an opposite direction to that of the plurality of first diodes connected in series.

10. The semiconductor system according to claim 7, wherein the second rectification circuit includes a plurality of second diodes having rectification directions aligned in the same direction connected in series.

11. The semiconductor system according to claim 10, wherein the second rectification circuit includes a plurality of fourth diodes having rectification directions aligned in an opposite direction to that of the plurality of second diodes connected in series.

12. The semiconductor system according to claim 1, wherein the first and second semiconductor chips are flash memory chips.

13. A semiconductor system comprising: a first semiconductor chip; a second semiconductor chip stacked above the first semiconductor chip; a controller configured to control the first and second semiconductor chips; a first wiring connected between the controller and each of the first and second semiconductor chips and by which a first signal is to be transmitted from the controller to each of the first and second semiconductor chips; a second wiring connected between the controller and each of the first and second semiconductor chips and by which a second signal is to be transmitted from the controller to each of the first and second semiconductor chips; a third wiring connected between the controller and the first semiconductor chip and by which currents of the first and second signals flowing through the first and second wirings to the first semiconductor chip are to be returned to the controller; and a fourth wiring connected between the controller and the second semiconductor chip and by which currents of the first and second signals flowing through the first and second wirings to the second semiconductor chip are to be returned to the controller, wherein the first semiconductor chip includes a first switching circuit in a current path between the first wiring and the third wiring, that is configured to electrically connect the first wiring and the third wiring or electrically disconnect the first wiring from the third wiring, and a second switching circuit in a current path between the second wiring and the third wiring, configured to electrically connect the second wiring and the third wiring or electrically disconnect the second wiring from the third wiring, and the second semiconductor chip includes a third switching circuit in a current path between the first wiring and the fourth wiring, that is configured to electrically connect the first wiring and the fourth wiring or electrically disconnect the first wiring from the fourth wiring, and a fourth switching circuit in a current path between the second wiring and the fourth wiring, that is configured to electrically connect the second wiring and the fourth wiring or electrically disconnect the second wiring from the fourth wiring.

14. The semiconductor system according to claim 13, wherein the controller is configured to detect a defect in the first semiconductor chip based on the current flowing through the third wiring and to detect a defect in the second semiconductor chip based on the current flowing through the fourth wiring.

15. The semiconductor system according to claim 13, wherein the controller is configured to set a voltage level supplied to the first and second wirings to be higher in a defect detecting mode of operating the first and second semiconductor chips than in a normal mode of operating the first and second semiconductor chips.

16. The semiconductor system according to claim 13, wherein the first semiconductor chip includes a first pad connected to one end of the third wiring, and the second semiconductor chip includes a second pad connected to one end of the fourth wiring, and during the defect detecting mode, the controller detects the currents flowing from the first and second wirings to the third wiring through the first and second switching circuits and the first pad, and detects the currents flowing from the first and second wirings to the fourth wiring through the third and fourth switching circuits and the second pad.

17. The semiconductor system according to claim 16, wherein the first semiconductor chip includes third pads electrically conducted with the first and second wirings, respectively, and the second semiconductor chip includes fourth pads electrically conducted with the first and second wirings, respectively, and during the defect detecting mode, the controller detects the currents flowing from the first and second wirings to the third wiring through the third pads, the first and second switching circuits, and the first pad, and detects the currents flowing from the first and second wirings to the fourth wiring through the fourth pads, the third and fourth switching circuits, and the second pad.

18. The semiconductor system according to claim 17, wherein each of the first and second wirings is connected to the controller, one of the third pads and one of the fourth pads, and the currents flowing from the first and second wirings to the third pads of the first semiconductor chip flow to the third wiring through the first and second switching circuits and the first pad, and the currents flowing from the first and second wirings to the fourth pads of the second semiconductor chip flow to the fourth wiring through the third and fourth switching circuits and the second pad.

19. The semiconductor system according to claim 13, wherein the controller brings the first switching circuit into a conducting state to electrically connect the first wiring and the third wiring and detect the current flowing from the first wiring to the third wiring, brings the second switching circuit into the conducting state to electrically connect the second wiring and the third wiring and detect the current flowing from the second wiring to the third wiring, brings the third switching circuit into a conducting state to electrically connect the first wiring and the fourth wiring and detect the current flowing from the first wiring to the fourth wiring, and brings the fourth switching circuit into the conducting state to electrically connect the second wiring and the fourth wiring and detect the current flowing from the second wiring to the fourth wiring.

20. A wiring defect detecting method comprising:

transmitting first and second signals respectively through first and second wirings to each of a first semiconductor chip and a second semiconductor chip stacked above the first semiconductor chip, from a controller configured to control the first and second semiconductor chips, wherein the first semiconductor chip includes a first switching circuit connected to the first wiring and a second switching circuit connected to the second wiring, and the second semiconductor chip includes a third switching circuit connected to the first wiring and a fourth switching circuit connected to the second wiring; and detecting a defect of the first and second wirings based on currents of the first and second signals flowing respectively in the first and second wirings, wherein the currents return to the controller through a respective one of the first and second switching circuits and a third wiring connected between the controller and the first semiconductor chip, and through a respective one of the third and fourth switching circuits and a fourth wiring connected between the controller and the second semiconductor chip.

* * * * *